United States Patent
Dodson

(10) Patent No.: US 11,075,499 B2
(45) Date of Patent: Jul. 27, 2021

(54) HEAT SINK COMPRISING SYNTHETIC DIAMOND MATERIAL

(71) Applicant: ELEMENT SIX TECHNOLOGIES LIMITED, Didcot (GB)

(72) Inventor: Joseph Michael Dodson, Ascot (GB)

(73) Assignee: Element Six Technologies Limited, Didcot (GB)

( * ) Notice: Subject to any disclaimer, the term of this patent is extended or adjusted under 35 U.S.C. 154(b) by 0 days.

(21) Appl. No.: 16/471,328

(22) PCT Filed: Dec. 15, 2017

(86) PCT No.: PCT/EP2017/083017
§ 371 (c)(1),
(2) Date: Jun. 19, 2019

(87) PCT Pub. No.: WO2018/114666
PCT Pub. Date: Jun. 28, 2018

(65) Prior Publication Data
US 2020/0088482 A1 Mar. 19, 2020

(30) Foreign Application Priority Data

Dec. 20, 2016 (GB) ........................... 1621690

(51) Int. Cl.
*H01S 5/024* (2006.01)
*F28F 21/02* (2006.01)
(Continued)

(52) U.S. Cl.
CPC .......... *H01S 5/02484* (2013.01); *F28F 21/02* (2013.01); *G02B 5/0808* (2013.01);
(Continued)

(58) Field of Classification Search
CPC ............. H01S 5/02484; H01S 5/02423; H01S 3/0407; H01S 3/0405; H01S 3/0604; H01L 23/473; H01L 23/3732
See application file for complete search history.

(56) References Cited

U.S. PATENT DOCUMENTS 4,715,438 A 12/1987 Gabuzda et al.
5,745,344 A * 4/1998 Baska ................. H01L 21/4871
165/185
(Continued)

FOREIGN PATENT DOCUMENTS

CN 101614325 A 12/2009
CN 202532777 U 11/2012
(Continued)

OTHER PUBLICATIONS

United Kingdom Patent Application No. GB1621690.5, Combined Search and Examination Report dated Mar. 29, 2017, 11 pages.
(Continued)

*Primary Examiner* — Yuanda Zhang
(74) *Attorney, Agent, or Firm* — Dean W. Russell; Clark F. Weight; Kilpatrick Townsend & Stockton LLP

(57) ABSTRACT

A heat sink comprising a heat spreader (2) made from synthetic diamond and having a front surface for mounting one or more components to be cooled like a laser disc (8) and a rear surface for direct fluid cooling (10). A plurality of ribs (4,7) is bonded to the rear surface of the heat spreader (2) to stiffen the heat spreader. Both the heat spreader and the plurality of ribs are formed of synthetic diamond material. The ribs (4,7) may be fixed to the heat spreader by braze bonds (6).

13 Claims, 2 Drawing Sheets

(51) Int. Cl.

| | |
|---|---|
| *G02B 5/08* | (2006.01) |
| *H01S 3/04* | (2006.01) |
| *H01S 3/06* | (2006.01) |
| *H01S 5/02* | (2006.01) |
| *H01L 23/473* | (2006.01) |
| *H05K 7/20* | (2006.01) |

(52) U.S. Cl.
CPC .......... *H01S 3/0405* (2013.01); *H01S 3/0407* (2013.01); *H01S 3/0604* (2013.01); *H01S 5/0216* (2013.01); *H01S 5/02423* (2013.01); *H01L 23/473* (2013.01); *H05K 7/20254* (2013.01)

(56) References Cited

U.S. PATENT DOCUMENTS

| | | | |
|---|---|---|---|
| 5,785,754 | A | 7/1998 | Yamamoto et al. |
| 6,390,181 | B1 | 5/2002 | Hall et al. |
| 2001/0048698 | A1 | 12/2001 | Lorenzen et al. |
| 2002/0023733 | A1* | 2/2002 | Hall .................... H01L 23/3732 165/80.3 |
| 2003/0183368 | A1 | 10/2003 | Paradis et al. |
| 2005/0019694 | A1 | 1/2005 | Huonker et al. |
| 2005/0070048 | A1* | 3/2005 | Tolchinsky ............. H01L 24/31 438/108 |
| 2006/0046304 | A1* | 3/2006 | Shigeura ................ G05D 23/20 436/147 |
| 2007/0224727 | A1 | 9/2007 | Dory |
| 2009/0092162 | A1* | 4/2009 | Huff .................... H01S 5/02256 372/36 |
| 2009/0323361 | A1* | 12/2009 | Liu ......................... F21V 29/74 362/373 |
| 2014/0182824 | A1* | 7/2014 | Hirotsuru ............. C23C 18/1653 165/133 |
| 2015/0171586 | A1 | 6/2015 | Schad et al. |

FOREIGN PATENT DOCUMENTS

| | | |
|---|---|---|
| CN | 202713872 U | 1/2013 |
| CN | 103733331 A | 4/2014 |
| CN | 105305206 A | 2/2016 |
| EP | 1035578 A1 | 9/2000 |
| FR | 2827079 A | 1/2003 |
| GB | 2300072 A | 10/1996 |
| WO | 0169676 A2 | 9/2001 |
| WO | 2011091430 A1 | 7/2011 |
| WO | 2012138524 A1 | 10/2012 |
| WO | 2013015158 A1 | 1/2013 |
| WO | 2018067204 A1 | 4/2018 |

OTHER PUBLICATIONS

United Kingdom Patent Application No. GB1720962.8, Combined Search and Examination Report dated Apr. 27, 2018, 9 pages.
International Patent Application No. PCT/EP2017/083017, International Search Report and Written dated Apr. 9, 2018, 15 pages.

* cited by examiner

HEAT SINK COMPRISING SYNTHETIC DIAMOND MATERIAL

FIELD OF INVENTION

The present invention relates to a heat sink comprising synthetic diamond material, and to a heat sink assembly comprising a heat sink.

BACKGROUND OF INVENTION

Heat sinks comprising synthetic diamond material are known in the art. Synthetic diamond materials are advantageous for use in heat sinks because of their extremely high thermal conductivity allowing efficient spreading of heat from hot spots and efficient transfer of heat from a heat generating component to a fluid coolant. Synthetic diamond materials are also advantageous in such applications because of their low thermal expansion coefficient and high rigidity thus having mechanical and geometric stability with low thermal deformation even when exposed to large temperature variations. This combination of features is particularly useful in optical applications such as laser systems which require precise geometry as well as efficient thermal performance. In such systems, optical components such as a laser discs and mirrors generate high temperatures and thus require efficient cooling while also maintaining a precise optical geometry to maintain performance. An example of a solid state laser system comprising a diamond heat sink is described in US2015/0171586. Similar criteria also apply for high power semiconductor applications.

While synthetic diamond heat sinks have enabled the development of higher power optical and semiconductor systems, next generation systems are pushing the limits of current synthetic diamond heat sinks in terms of thermal performance and mechanical stability.

It is an aim of embodiments of the present invention to provide a cost effective solution to the provision of heat sinks which have improved stiffness and improved heat transfer performance.

SUMMARY OF INVENTION

As described in the background section, heat sinks need to be non-distorting under thermal and cooling loads. This means that heat sinks need to be stiff and have good thermal transfer into a fluid coolant.

Stiffness of a synthetic diamond heat sink can be increased by either growing a thicker plate of synthetic diamond material or otherwise bonding two or more plates of synthetic diamond material together via their major faces. Both these solutions have the disadvantage of significantly increasing cost, as a large volume of diamond material is required. Furthermore, growing very thick plates of synthetic diamond material is difficult and there is an upper limit to the thickness of a singular synthetic diamond plate which can be grown. Further still, bonding of two or more plates of diamond together via their major faces results in a significant volume of adhesive which introduces a thermal barrier within the diamond component and reduces mechanical stability under thermal loading. Efficiency of heat transfer from the heat generating component to the fluid coolant is reduced.

Efficiency of heat transfer from the heat generating component to the fluid coolant can be increased by machining grooves or other surface features on a rear fluid cooled surface of the synthetic diamond heat sink. US 2003/0183368 describes a diamond heat sink in which fins are laser cut into a diamond substrate thereby allowing greater heat transfer from the fins. However, this approach is only practical where stiffness of the component is not a primary consideration, because cutting fins into diamond significantly decreases overall stiffness of the heat sink component. Such a component is more likely to distort when exposed to temperature variations and so is not suitable for optical applications such as laser systems.

According to a first aspect of the present invention there is provided a heat sink comprising:
   a heat spreader having a front surface for mounting one or more components to be cooled and a rear surface for direct fluid cooling; and
   a plurality of ribs bonded to the rear surface of the heat spreader to stiffen the heat spreader,
   wherein both the heat spreader and the plurality of ribs are formed of synthetic diamond material.

According to a second aspect of the present invention there is provided a heat sink assembly comprising:
   a synthetic diamond heat sink according to the first aspect of the invention comprising a heat spreader having a front surface and a rear and a plurality of ribs bonded to the rear surface of the heat spreader to stiffen the heat spreader;
   a heat generating component bonded to the front surface of the heat spreader; and
   a fluid cooling system configured to deliver fluid to the rear surface of the heat spreader.

The present invention is particularly suited to free standing synthetic diamond heat sinks which are directly fluid cooled rather than mounted on a solid support substrate which is itself fluid cooled. The provision of a plurality of synthetic diamond ribs on a rear surface of a synthetic diamond heat spreader improves stiffness of the heat spreader and improves heat transfer from the heat spreader into a fluid coolant. Furthermore, less diamond is required compared to the provision of a single thick plate of synthetic diamond material or multiple thinner plates of synthetic diamond material bonded together thereby reducing cost. Further still, as the bonding area is reduced using ribs when compared with a solution in which two or more plates of synthetic diamond are bonded via major faces, problems of thermal barrier resistance and thermal stability are reduced.

Forming both the heat spreader and the plurality of ribs from synthetic diamond material provides the best combination of thermal conductivity, stiffness, and thermal expansion coefficient matching between the ribs and the heat spreader.

As an option, the ribs are bonded to the rear surface by braze bonds.

The heat spreader optionally has a thickness in a range of 0.8 mm to 4.5 mm, and the ribs optionally have a thickness in the same range.

In order to ensure a good contact between the rear surface and the ribs, the rear surface of the heat spreader optionally has a flatness of less than 10 µm at least over the regions where the ribs are bonded. The flatness may optionally be less than 2 µm. Optionally, each rib has an interface surface bonded to the rear surface of the heat spreader, the interface surface having a flatness of less than 10 µm or less than 2 µm.

The front surface of the heat spreader optionally has a convex or concave curvature at least over a portion of the front surface.

The front surface of the heat spreader optionally includes a reflective coating over all or part of the front surface.

The plurality of ribs are optionally disposed on the rear surface of the heat spreader in an axially symmetric pattern, in order to ensure that the stiffness of the component is uniform in any axial direction.

Embodiments of the present invention including further optional and preferred features are described in the detailed description.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION

Figure 1A:
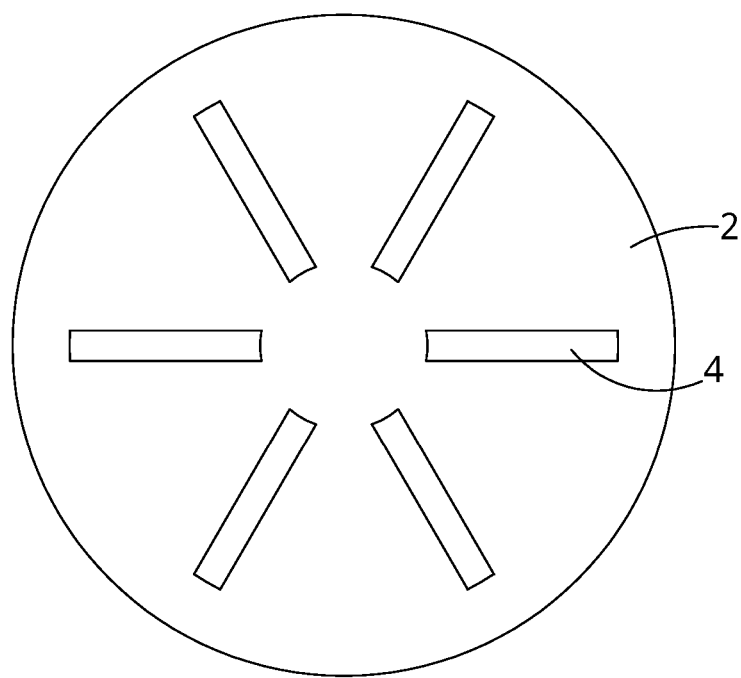
FIGS. 1(a) and 1(b) show schematic illustrations of a heat sink according to an embodiment of the invention.

As described in the summary of invention section, one aspect of the present invention is concerned with the fabrication of a heat sink comprising:

a heat spreader having a front surface for mounting one or more components to be cooled and a rear surface for direct fluid cooling; and a plurality of ribs bonded to the rear surface of the heat spreader to stiffen the heat spreader, wherein both of the heat spreader and the plurality of ribs are formed of synthetic diamond material.

To fabricate such a heat sink, the rear surface of the heat spreader can be processed to a flatness of less than 10 micrometres, preferably less than 2 micrometres, at least over regions to be bonded to the ribs. Each rib has an interface surface to be bonded to the rear surface of the heat spreader. These interface surfaces can also be processed to a flatness of less than 10 micrometres, preferably less than 2 micrometres. The plurality of ribs can then be bonded to the rear surface of the heat spreader by, for example, braze bonds or metal diffusion bonds. For example, an active carbide forming braze bond can be utilized such as those containing titanium or an alternative carbide forming component for bonding to diamond. High temperature braze bonds can be utilized as there is no thermal expansion coefficient mismatch if synthetic diamond is utilized for both the heat spreader and ribs.

The heat spreader may have a thickness in a range 0.8 mm to 4.5 mm. Generally embodiments of the present invention will be applicable where relatively thick, stiff heat sinks are required but where cost or synthesis capability prohibits greater thicknesses. The ribs may also have a thickness in a range 0.8 mm to 4.5 mm. The ribs will generally have a thickness which does not significantly exceed that of the heat spreader to avoid the requirement to grown thicker pieces of diamond material which is challenging and expensive. Advantageously, the heat spreader and the ribs will have the same thickness and can thus be grown using the same synthesis process. Alternatively, each rib may comprise more than one layer of diamond material bonded together, e.g. via braze bonds. It is currently challenging to produce heat spreaders in a cost-effective manner with a high thickness (for example, over around 4.5 mm). Bonding ribs to a heat spreader gives the heat spreader a stiffness that is much greater than that of a heat spreader without ribs, and therefore makes the heat spreader suitable for higher power optical and semiconductor systems.

As the lateral dimension of the ribs is significantly smaller than that of the heat spreader, more efficient use of the diamond material is achieved while retaining the desired rigidity. The lateral dimension of the ribs should be sufficiently large as to provide sufficient braze area and bonding strength. Furthermore, the spacing of the ribs should be sufficiently small to achieve the desired level of stiffness under thermal and cooling loads. For example, the spacing between the ribs may be approximately the same as the thickness of the heat spreader. For certain applications it is advantageous for the plurality of ribs to be configured in an axially symmetric pattern over the rear surface of the heat spreader. For example, this is advantageous in many optical applications so any optical distortions within, for example, a laser cavity are symmetric, and the flexural strength of the heat spreader is substantially uniform regardless of the axial direction in which it is measured.

The front surface of the heat spreader may be processed to have a convex or concave curvature at least over a portion of the front surface. For example, a concave curvature may be provided for provision of a concave mirror component. Alternatively, a slightly convex curvature can be advantageous to ensure a good contact when bonded to an overlying component. The front surface of the heat spreader may also comprise a reflective coating for many optical applications.

Figure 1B:
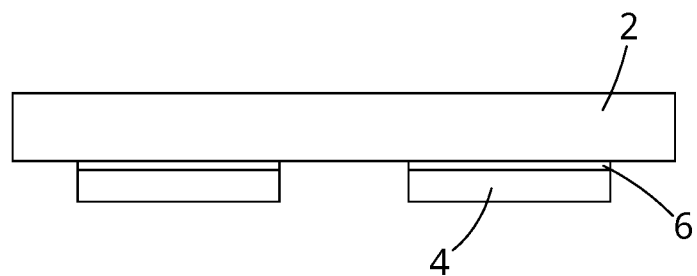

FIGS. 1(a) and 1(b) show schematic illustrations of a heat sink according to an embodiment of the invention. The heat sink comprises a synthetic diamond heat spreader 2 with synthetic diamond ribs 4 bonded to a rear surface of the synthetic diamond heat spreader as shown in plan view in FIG. 1(a). FIG. 1(b) shows a cross-sectional view of the heat sink showing the ribs 4 bonded to the heat spreader 2 via braze bonds 6.

Figure 2:
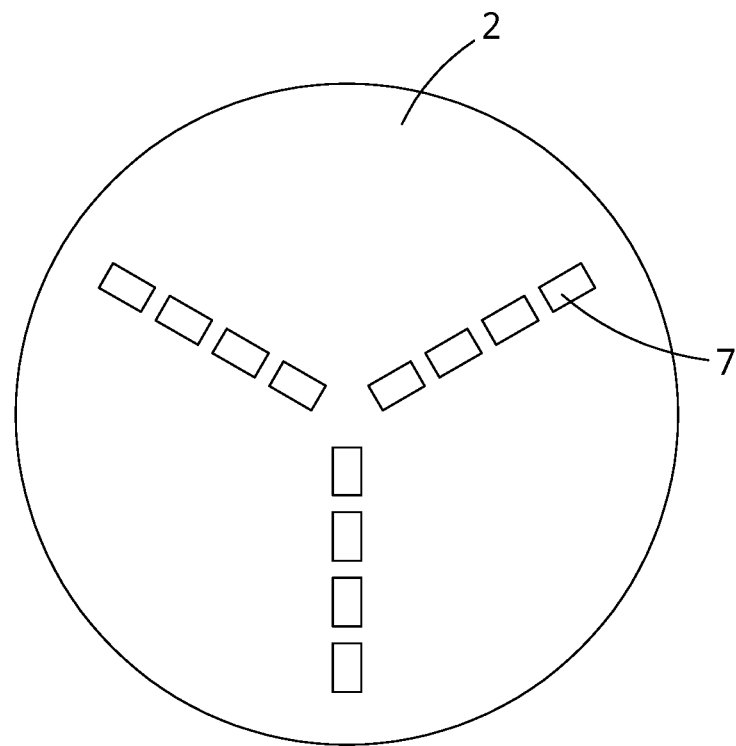
FIG. 2 shows a schematic illustration of a heat sink according to another embodiment of the invention.

The embodiment illustrated in FIGS. 1(a) and 1(b) comprises six ribs in a radial distribution akin to spokes of a wheel. FIG. 2 shows a schematic illustration of a heat sink according to another embodiment of the invention. This embodiment also comprises a synthetic diamond heat spreader 2 with ribs bonded to a rear surface thereof via braze bond. Here, rather than using elongate ribs a plurality of smaller (shorter) pieces of synthetic diamond material 7 are distributed to form each major supporting rib. Such a configuration can be fabricated using off-cuts of diamond, e.g. from the process used to fabricate the heat spreader, which would otherwise be discarded. As such, this approach can utilize a larger fraction of diamond material, reducing waste and decreasing fabrication costs.

Figure 3:
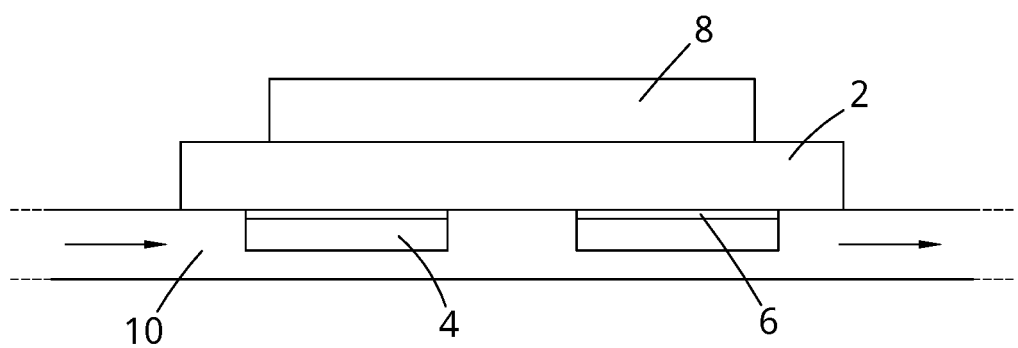
FIG. 3 shows a schematic illustration of a heat sink assembly comprising a heat generating component, a heat sink, and a fluid cooling system.

A heat sink assembly can be constructed using the heat sink configuration as described herein. FIG. 3 shows a schematic illustration of an example of such a heat sink assembly. The heat sink assembly comprises a heat sink as described herein comprising a heat spreader 2 having a front surface and a rear and a plurality of ribs 4 bonded to the rear surface of the heat spreader via braze bonds 6 to stiffen the heat spreader 2. A heat generating component 8 is bonded to the front surface of the heat spreader. For example, the heat generating component 8 can be a laser disc comprising a laser-active medium or a reflecting structure (i.e. a mirror). A fluid cooling system 10 is configured to deliver fluid to the rear surface of the heat spreader.

While preferably both the heat spreader and the plurality of ribs are each formed of monolithic synthetic diamond material to provide the best combination of thermal conductivity, stiffness, and thermal expansion coefficient matching between the ribs and the heat spreader, it is also envisaged that some benefits can be achieved by applying synthetic diamond stiffening ribs to a heat spreader formed of a different material. Alternatively, it is also envisaged that some benefits can be achieved by applying non-diamond stiffening ribs to a synthetic diamond heat spreader to stiffen the heat spreader if, for example, the synthetic diamond heat spreader is relatively thin. Alternative materials may include sapphire and zinc selenide. For example, a sapphire or zinc selenide substrate may be stiffened using diamond ribs.

The term "stiffness" is used herein to refer to the resistance of a component to deflection under a given load. Stiffness of a component depends not only on the Young's Modulus of the component material, but also on how the component is loaded, and the dimensions and shape of the component. For the purposes of a heat spreader used in a high power optical or semiconductor application, the flexural stiffness is important. A heat spreader with a plurality of ribs bonded to it is stiffer than a heat spreader with no ribs bonded to it.

The primary purpose of the ribs is to stiffen the heat spreader, although they also have the additional purpose of increasing the surface area to spread heat. However, the fins of a conventional heat spreader are designed to maximize the surface area to volume ratio in order to greatly increase the overall surface area and so maximize the heat spreading. In the present application, the ribs are required for stiffening, and so maximizing the surface area to volume ratio of the ribs would reduce the amount of stiffening required. The ribs therefore increase the overall surface of the rear surface of the heat spreader by no more than 100%, by no more than 75% by no more than 50% or by no more than 30%.

By way of example, FIG. 1a shows a heat spreader 2 with a rear surface having a diameter of 90 mm, leading to a surface area of 6362 mm². Six ribs 4 are brazed to the rear surface. Each rib has dimensions of 27×5×4.5 mm. The total exposed surface area of each ribs 4 is 423 mm², leading to an additional surface area for six ribs of 2538 mm². The increase in surface area is therefore less than 40%.

Using the further example of FIG. 2, a heat spreader 2 is shown with a rear surface having a diameter of 90 mm, leading to a surface area of 6363 mm². Twelve ribs 7 are brazed to the rear surface. Each rib has dimensions of 7×5×4.5 mm. The total exposed area of each ribs 7 is 143 mm², leading to an additional surface area for six ribs of 1716 mm². The increase in surface area is therefore less than 27%. By using ribs with a lower surface area to volume ratio than heat spreading fins have, the stiffening effect of the ribs is maximized.

While this invention has been particularly shown and described with reference to embodiments, it will be understood to those skilled in the art that various changes in form and detail may be made without departing from the scope of the invention as defined by the appended claims.

The invention claimed is:

1. A heat sink comprising:
   a heat spreader having a front surface for mounting one or more components to be cooled and a rear surface for direct fluid cooling; and
   a plurality of ribs bonded to the rear surface of the heat spreader to stiffen the heat spreader,
   wherein both the heat spreader and the plurality of ribs are formed of synthetic diamond material; and
   wherein the rear surface of the heat spreader has a flatness of less than 10 micrometres at least over regions bonded to the ribs, and wherein each rib has an interface surface bonded to the rear surface of the heat spreader, the interface surface having a flatness of less than 10 micrometres.

2. The heat sink according to claim 1, wherein the plurality of ribs are bonded to the rear surface of the heat spreader by braze bonds.

3. The heat sink according to claim 1, wherein the heat spreader has a thickness in a range 0.8 mm to 4.5 mm.

4. The heat sink according to claim 1, wherein the plurality of ribs each have a thickness in a range 0.8 mm to 4.5 mm.

5. The heat sink according to claim 1, wherein the flatness of the rear surface of the heat spreader is less than 2 micrometres at least over regions bonded to the ribs.

6. The heat sink according to claim 1, wherein the flatness of the interface surface of each rib is less than 2 micrometres.

7. The heat sink according to claim 1, wherein the front surface of the heat spreader has a convex or concave curvature at least over a portion of the front surface.

8. The heat sink according to claim 1, wherein the front surface of the heat spreader comprises a reflective coating.

9. The heat sink according to claim 1, wherein the plurality of ribs are configured in an axially symmetric pattern over the rear surface of the heat spreader.

10. The heat sink according to claim 9, wherein the axially symmetric pattern of ribs over the rear surface of the heat spreader is configured to provide axially symmetric flexural stiffness to the heat sink.

11. A heat sink assembly comprising:
    a heat sink according to claim 1;
    a heat generating component bonded to the front surface of the heat spreader; and
    a fluid cooling system configured to deliver fluid to the rear surface of the heat spreader.

12. The heat sink assembly according to claim 11, wherein the heat generating component is a laser disc comprising a laser-active medium.

13. The heat sink assembly according to claim 11, wherein the heat generating component is a reflecting structure.

\* \* \* \* \*